United States Patent [19]

Harrington et al.

[11] 4,295,267

[45] Oct. 20, 1981

[54] TWO-MASK VJ-FET TRANSISTOR STRUCTURE

[75] Inventors: Alan L. Harrington, Glendale; Vladimir Rodov, Hollywood; Richard Allison, Los Angeles, all of Calif.

[73] Assignee: TRW Inc., Los Angeles, Calif.

[21] Appl. No.: 170,144

[22] Filed: Jul. 18, 1980

[51] Int. Cl.³ .......................................... H01L 21/20
[52] U.S. Cl. .................... 29/571; 29/576 W; 148/187; 357/22
[58] Field of Search ............ 29/571, 576 W; 148/187; 357/22

[56] References Cited

U.S. PATENT DOCUMENTS 3,930,300  1/1976  Nicolay ............................ 29/571
3,975,221  8/1976  Rodgers ........................... 29/571
4,003,126  1/1977  Holmes et al. .................... 29/571

Primary Examiner—G. Ozaki
Attorney, Agent, or Firm—Martin R. Horn

[57] ABSTRACT

A simplified method of fabricating V-groove junction field effect transistors using only two masking steps. The first masking step opens regions in an ohmic refractory metal layer deposited on a doped semiconductor wafer. V-grooves are anisotropically etched into the wafer through the openings, thereby defining source and drain regions and outer isolation V-grooves. The wafer is then coated with a passivating layer. The second masking step creates openings through the passivation layer to the source and drain regions, and electrical contacts to those regions are made. An ohmic contact to the back surface of the wafer forms the gate electrode. Multiple source and drain regions may be created between the outer isolation V-grooves and electrically parallel for a greater current rating.

5 Claims, 3 Drawing Figures

TWO-MASK VJ-FET TRANSISTOR STRUCTURE

BACKGROUND OF INVENTION

1. Field of the Invention

This invention relates to a method of fabrication of semiconductor devices, and more particularly to a simplified method of making V-groove junction field effect transistor devices.

2. Description of the Prior Art

The economical manufacture of semiconductor transistor devices using present-day techniques is directly related to the number of masking steps required during the manufacturing process, and to the number of transistor devices that may be formed on each wafer. With respect to the making of V-groove junction field effect transistors (VJ-FET's) in particular, the prior art discloses the need to use at least three masking steps (and often four with passivation) during the manufacturing process. As the number of masking steps increases, the ultimate yield of working devices decreases and the total processing time increases. Further, the more masks required during fabrication, the fewer transistor devices that can be manufactured on a wafer because of the cumulative mask alignment tolerances incurred. It is therefore economically advantageous to be able to manufacture VJ-FET devices with fewer than three masks, while retaining the desirable electrical and physical characteristics of the overall VJ-FET device structure.

Accordingly, it is an object of the present invention to provide a very simple method of producing VJ-FET devices utilizing only two photolithographic masking steps.

It is a further object of the present invention to provide a simplified method for increasing the yield and density of VJ-FET devices on a semiconductor wafer.

This and other objects of the present invention are achieved by a VJ-FET device fabrication method using only two photolithographic masking steps, wherein preferential etching of the semiconductor wafer material results in a V-shaped groove between the source and drain regions with the device channel passing around the V-groove. Also disclosed are V-shaped isolation grooves surrounding the active regions of a VJ-FET and formed concurrently with the V-groove separating the source and drain regions.

BRIEF SUMMARY OF THE INVENTION

In the present invention, an n-channel silicon VJ-FET device is shown, although the processing steps would apply equally as well to the formation of p-channel devices.

In the preferred embodiment, an n− epitaxial layer is formed on a p+ silicon substrate. Thereafter an n+ layer is formed over the entire surface of the wafer. Once the initial wafer preparation is completed, an ohmic refractory metal-to-silicon contact layer is deposited over the entire wafer by conventional means. Using conventional photoresist and photolithographic techniques, a first mask opens up areas in the metal contact layer, thereby defining regions where the V-grooves will be formed subsequently. The metal in the metal contact layer may be gold or any other metal that can withstand conventional V-groove etchants, such as hydrazine or potassium hydroxide solutions.

Once the first mask opens up the areas to be V-grooved, the entire wafer is exposed to etchant materials, and the V-grooves actually formed. In the present embodiment, two outer isolation V-grooves and an inner device definition V-groove are formed. The inner device definition V-groove defines two island-like regions, one of which is the source region for the VJ-FET device, the other of which is the drain region.

The depth of both the outer and inner V-grooves is accurately controlled by the width of the openings created in the metal contact layer by the first masking step. The wider the metal contact layer opening, the deeper the V-groove.

After V-grooving the wafer, a passivation layer is deposited over the entire surface of the wafer. A second mask is then utilized, again employing conventional photoresist and photolithographic techniques, to open contact regions in the passivation layer over each of the two previously defined active region islands. Contacts are then made to the source and drain regions of the VJ-FET device. The gate for the VJ-FET device is formed by an ohmic contact on the back surface of the wafer and beneath the source-drain regions, thereby completing the formation of the VJ-FET device in accordance with the present invention.

BRIEF DESCRIPTION OF THE DRAWINGS

Like numbers in the various figures refer to like parts. The vertical dimension in each figure is exaggerated for clarity.

DETAILED DESCRIPTION

Figure 1:
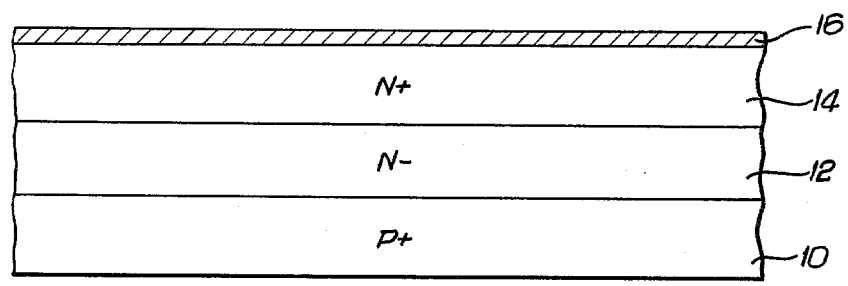
FIG. 1 is a cross-sectional view of a semiconductor wafer prior to the first masking step in accordance with the present invention.

Referring to FIG. 1, the basic substrate for forming a p-type silicon (n-channel) VJ-FET device in accordance with the present invention is shown. However, the processing steps described herein would apply equally as well to the formation of a p-channel VJ-FET device.

The processing begins with a wafer of p+ type silicon 10 of (100) crystallographic orientation. The (100) crystallographic orientation allows for the subsequent preferential etching of sharp, chisel-shaped grooves. An n− epitaxial layer 12 is thereafter grown in conventional fashion on the silicon substrate 10. Next, an n+ ohmic layer 14 is formed over the entire surface of the wafer. The formation of the n+ ohmic layer 14 may be carried out using known low-temperature fabrication methods, if desired. Low temperature processing keeps to a minimum thermally-induced migration of the doping material used, thereby allowing accurate control of the thickness and electrical characteristics of each layer in the semiconductor wafer.

After the n+ ohmic layer 14 is formed, an ohmic refractory metal layer 16 capable of withstanding conventional V-groove etchants, such as hydrazine or potassium hydroxide solutions, is deposited over the entire surface of the wafer. The n+ ohmic layer 14 provides an ohmic contact between the metal layer 16 and the active regions to be formed subsequently in the n− epitaxial layer 12. The metal layer 16 may be formed by known low-temperature fabrication means, if desired.

Once the refractory metal layer 16 is deposited over the wafer, the wafer is ready for the first making step. Utilizing conventional photoresist and photolithographic techniques, a first mask is applied to the prepared wafer. The refractory metal layer 16 is etched away from the areas defined by the first mask, exposing portions of the upper surface of the doped semiconductor substrate.

Figure 2:
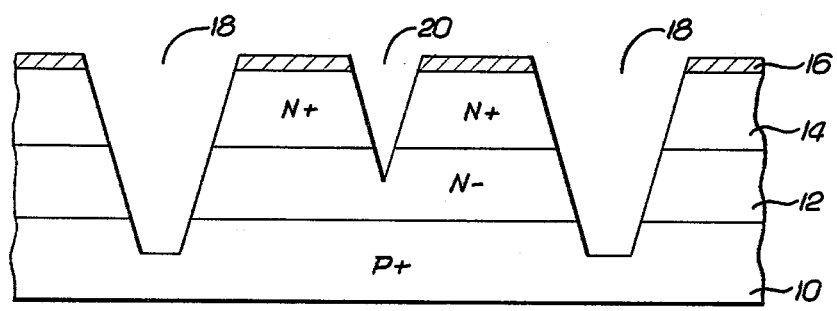
FIG. 2 is a cross-sectional view of the VJ-FET wafer after the first masking step and etchant process in accordance with the present invention.

Referring now to FIG. 2, there is disclosed the three openings created in the ohmic refractory metal layer 16 by the first masking step. The inner opening 20 and the two outer isolation openings 18 serve to define two island-like regions which, with further processing, will become the drain and source regions of the VJ-FET device.

The openings created by the first mask are of two sizes, the two outer isolation openings 18 being larger than the inner device definition opening 20. By controlling the width of the openings in the first mask, the depth of the V-grooves formed by subsequent etching can be accurately controlled.

Once the openings in the silicon wafer are defined by the first masking step, the entire wafer is subjected to an anisotropic etchant, such as a hydrazine or potassium hydroxide solution. The etchant used etches the (100) crystallographic plane of a (100) oriented silicon crystal much faster than the (111) planes, resulting in longitudinal V-grooves in the surface of the wafer, with (111) planes forming the walls at an angle of approximately 55 degrees from the horizontal. Each V-groove is self-stopping unless prematurely removed from the etchant solution, in which case the groove is truncated.

The outer isolation V-grooves 18 are of greater depth than V-groove 20, due to the difference in the widths of the openings in the metal layer 16 created by the first masking step, and serve to electrically isolate the source and drain regions of the VJ-FET device from adjacent circuitry or devices.

Figure 3:
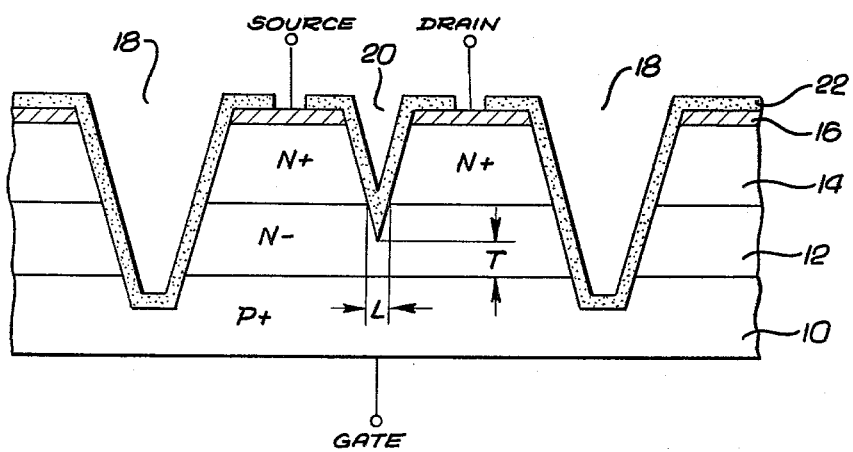
FIG. 3 is a cross-sectional view of the VJ-FET wafer after the second masking step in accordance with the present invention.

Referring now to FIG. 3, after the outer and inner V-grooves 18, 20 are formed, a passivation layer 22 is applied over the entire surface of the wafer in a conventional manner. Again, the formation of the passivation layer 22 may be carried out at low temperature to accurately control the electrical characteristics of the subsurface layers of the wafer.

After the passivation layer 22 is applied, the second masking step required by the present invention is performed on the wafer, again employing conventional photoresist and photolithographic techniques, to define openings in the passivation layer 22 over the two islands previously defined by the formation of the outer and inner V-grooves 18, 20.

Once the openings in the passivation layer 22 have been formed, the VJ-FET device is completed by forming contacts of the two islands, and to the bottom of the substrate 10 underneath the inner V-groove 20. An ohmic contact is made to the bottom of the substrate 10, and forms the gate contact for the VJ-FET. One island at the upper surface of the wafer is the drain for the device, and the other island is the source region for the device.

In the present invention, the channel length of the VJ-FET is determined by the depth of the inner device definition V-groove 20 (which in turn is controlled by the width of the first mask opening in the refractory metal layer 16), and by the depth of the junction between the n+ ohmic layer 14 and the n− epitaxial layer 12. The channel thickness is determined by the depth of the device definition V-groove 20 and the depth of the junction between the n− epitaxial layer 12 and the p+ substrate 10. All of these dimensions can be accurately controlled to permit the fabrifabrication of VJ-FET devices with very short channels and with reproducible electrical and physical characteristics.

The present invention may also be employed in fabricating a VJ-FET device having a multiplicity of alternating source and drain regions between the isolation V-grooves. The multiple source regions and drain regions may be electrically connected in parallel in order to increase the current rating of the device.

Because the present invention requires only two masking steps to fabricate VJ-FET devices, the density of such devices on each wafer is increased significantly over the prior art, due to the lesser accumulation of mask alignment tolerance errors.

Although the simplified two-mask manufacturing technique of the present invention has been described only in the context of a standard VJ-FET device, the method disclosed is compatible with any J-FET design employing V-grooves, such as V-groove versions of the static induction transistors disclosed in U.S. Pat. No. 4,115,792 to Nishizawa. For example, controlling the depth of the inner device definition V-groove 20 determines whether a device fabricated in accordance with the present invention will be a VJ-FET or a V-groove static induction transistor. With a sufficiently small channel thickness, typically about 1 micron, the device will function as a V-groove static induction transistor. The exact channel thickness required varies in known fashion with the resistivities of the p+ substrate 10 and the n− epitaxial layer 12.

Although the preferred embodiment of the present invention has been described, it is also possible to make other changes without departing from the spirit or scope of this invention. For example, different preferentially etched planes in the silicon substrate may be utilized to form the grooves other than those planes specifically mentioned herein. Also, other arrangements for the source and drain regions may be used. The invention, therefore, is not to be limited to the specific embodiment discussed and illustrated herein, but rather only by the scope of the appended claims.

We claim:

1. A method of making field effect transistor devices comprising:
   (a) forming a wafer consisting of an epitaxial layer of semiconductor material of a first conductivity type on a substrate of semiconductor material of a second conductivity type;
   (b) forming an ohmic layer of semiconductor material of a third conductivity type in the epitaxial layer;
   (c) forming an ohmic refractory metal layer on the surface of the ohmic layer;
   (d) creating a central and two outer openings in the metal layer, wherein the outer openings are wider than the central opening;
   (e) forming, through the central opening, a device definition V-groove by anistropically etching the semiconductor wafer, said device definition V-groove extending through the ohmic layer, dividing it into separate regions, and into the epitaxial layer, thereby defining a conduction channel between the separate regions around the device definition V-groove;
   (f) forming, through the outer openings, isolation V-grooves by anistropically etching the semiconductor wafer, said isolation V-grooves extending through the ohmic layer and the epitaxial layer into the substrate, thereby defining the outer edges of the separate regions;

(g) forming a passivating layer on the front surface of the wafer;

(h) creating openings in the passivating layer over the separate regions;

(i) forming metal contacts to the separate regions, thereby defining source and drain electrodes; and (j) forming an ohmic contact to the back surface of the wafer beneath the device definition V-groove, thereby defining the gate electrode.

2. A method of making field effect transistor devices comprising:

(a) forming a wafer consisting of an epitaxial layer of semiconductor material of a first conductivity type on a substrate of semiconductor material of a second conductivity type, the surface of said wafer having a (100) crystallographic orientation;

(b) forming an ohmic layer of semiconductor material of a third conductivity type in the epitaxial layer;

(c) forming an ohmic refractory metal layer on the surface of the ohmic layer;

(d) creating a central and two outer openings in the metal layer, wherein the outer openings are wider than the central opening;

(e) forming, through the central opening, a device definition V-groove by anistropically etching the semiconductor wafer along the (111) crystallographic planes exposed by the central opening, said device definition V-groove extending through the ohmic layer, dividing it into separate regions, and into the epitaxial layer, thereby defining a conduction channel between the separate regions around the device definition V-groove;

(f) forming, through the outer openings, isolation V-grooves by anistropically etching the semiconductor wafer along the (111) crystallographic planes exposed by the outer openings, said isolation V-grooves extending through the ohmic layer and the epitaxial layer into the substrate, thereby defining the outer edges of the separate regions;

(g) forming a passivating layer on the front surface of the wafer;

(h) creating openings in the passivating layer over the separate regions;

(i) forming metal contacts to the separate regions, thereby defining source and drain electrodes; and (j) forming an ohmic contact to the back surface of the wafer beneath the central V-groove, thereby defining the gate electrode.

3. A method of making field effect transistor devices comprising:

(a) forming a wafer consisting of an epitaxial layer of semiconductor material of a first conductivity type on a substrate of semiconductor material of a second conductivity type, (b) forming an ohmic layer of semiconductor material of a third conductivity type in the epitaxial layer;

(c) forming an ohmic refractory metal layer on the surface of the ohmic layer;

(d) creating a multiplicity of inner openings and two outer openings in the metal layer, wherein the outer openings are wider than any of the inner openings;

(e) forming, through each inner opening, a device definition V-groove by anistropically etching the semiconductor wafer, said device definition V-grooves extending through the ohmic layer, separating the ohmic layer into a multiplicity of alternating source and drain regions, and into the epitaxial layer, thereby defining a multiplicity of conduction channels, each conduction channel being between a source and drain region and around one of said device definition V-grooves;

(f) forming, through the outer openings, isolation V-grooves by anistropically etching the semiconductor wafer, said isolation V-grooves extending through the ohmic layer and the epitaxial layer into the substrate, thereby electrically isolating the source and drain regions;

(g) forming a passivating layer on the front surface of the wafer;

(h) creating an opening in the passivating layer over each source and drain region;

(i) forming metal contacts to the source regions, thereby defining source electrodes, and to the drain regions, thereby defining drain electrodes; and (j) forming an ohmic contact to the back surface of the wafer, thereby defining the gate electrode.

4. A method of making field effect transistor devices comprising:

(a) forming a wafer consisting of an epitaxial layer of semiconductor material of a first conductivity type on a substrate of semiconductor material of a second conductivity type, the surface of said wafer having a (100) crystallographic orientation;

(b) forming an ohmic layer of semiconductor material of a third conductivity type in the epitaxial layer;

(c) forming an ohmic refractory metal layer on the surface of the ohmic layer;

(d) Creating a multiplicity of inner openings and two outer openings in said metal layer, wherein the outer openings are wider than any of the inner openings;

(e) forming, through each inner opening, a device definition V-groove by anistropically etching the semiconductor wafer along the (111) crystallographic planes exposed by the inner opening, said device definition V-grooves extending through the ohmic layer, dividing the ohmic layer into a multiplicity of alternating source and drain regions, and into said epitaxial layer, thereby defining a multiplicity of conduction channels, each conduction channel being between a source and drain region and around one of said device definition V-grooves;

(f) forming, through the outer openings, isolation V-grooves by anistropically etching the semiconductor wafer along the (111) crystallographic planes exposed by the outer openings, said isolation V-grooves extending through the ohmic layer and the epitaxial layer into the substrate, thereby electrically isolating the source and drain regions;

(g) forming a passivating layer on the front surface of the wafer;

(h) creating openings in the passivating layer over each source and drain region;

(i) forming metal contacts to the source regions, defining source electrodes, and to the drain regions, thereby defining drain electrodes; and (j) forming an ohmic contact to the back surface of the wafer, thereby defining the gate electrode.

5. The method of making field effect transistor devices of claims 1, 2, 3, or 4, wherein the semiconductor material of first conductivity type is n−, the semiconductor material of second conductivity type is p+, and the semiconductor material of third conductivity type is n+.

* * * * *